(12) United States Patent
Komiyama

(10) Patent No.: US 6,457,627 B1
(45) Date of Patent: Oct. 1, 2002

(54) BONDING CAPILLARY AND SEMICONDUCTOR DEVICE

(75) Inventor: Mitsuru Komiyama, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/659,760

(22) Filed: Sep. 11, 2000

(30) Foreign Application Priority Data

Mar. 9, 2000 (JP) .................................... 2000-065160

(51) Int. Cl.[7] .............................. B23K 1/06; B23K 37/00
(52) U.S. Cl. .......................................... 228/4.5; 228/1.1
(58) Field of Search .............................. 228/4.5, 180.5, 228/110.1, 1.1, 51, 55

(56) References Cited

U.S. PATENT DOCUMENTS

| | | | | |
|---|---|---|---|---|
| 3,575,336 A | * | 4/1971 | Booth | 219/229 |
| 4,098,125 A | * | 7/1978 | Lee | 422/925 |
| 4,728,214 A | * | 3/1988 | Mutschler | 401/258 |
| 4,974,767 A | * | 12/1990 | Alfaro et al. | 228/4.5 |
| 5,662,261 A | * | 9/1997 | Fogal | 228/180.5 |
| 5,906,308 A | * | 5/1999 | Yamazaki et al. | 228/4.5 |
| 5,934,543 A | * | 8/1999 | Koduri | 228/102 |
| 5,944,249 A | * | 8/1999 | Macabitas et al. | 228/180.5 |
| 5,985,651 A | * | 11/1999 | Hunicke-Smith | 165/177 |
| 6,215,195 B1 | * | 4/2001 | Koduri | 156/580.1 |
| 6,309,891 B1 | * | 10/2001 | Shalon et al. | 101/494 |
| 6,311,890 B1 | * | 11/2001 | Chapman et al. | 228/180.5 |
| 6,325,269 B1 | * | 12/2001 | Suzuki et al. | 228/1.1 |

* cited by examiner

Primary Examiner—M. Alexandra Elve
Assistant Examiner—Colleen P. Cooke
(74) Attorney, Agent, or Firm—Rabin & Berdo, P.C.

(57) ABSTRACT

A capillary is prevented from contacting an adjacent wire when bonding a given wire to an electrode pad on a semiconductor element, and can increase a compression bonding area when bonding the given wire to a post portion. The capillary has a set load for wire bonding greater than an urging force of a spring. A small-diameter portion is accommodated in an accommodating portion of the capillary main body, and an end face of the end of the capillary main body and an end surface of the small-diameter portion substantially align when the given wire is bonded to the post portion. The compression bonding portion therefore has substantially the same area as that formed by bonding using a normal capillary. Accordingly, the bonding strength of the post portion increases. Even if a semiconductor device has a multi-pin structure and is formed as a large-sized package, the post portion can withstand stress acting thereon at the time of resin-sealing for the semiconductor element.

6 Claims, 9 Drawing Sheets

F I G. 1
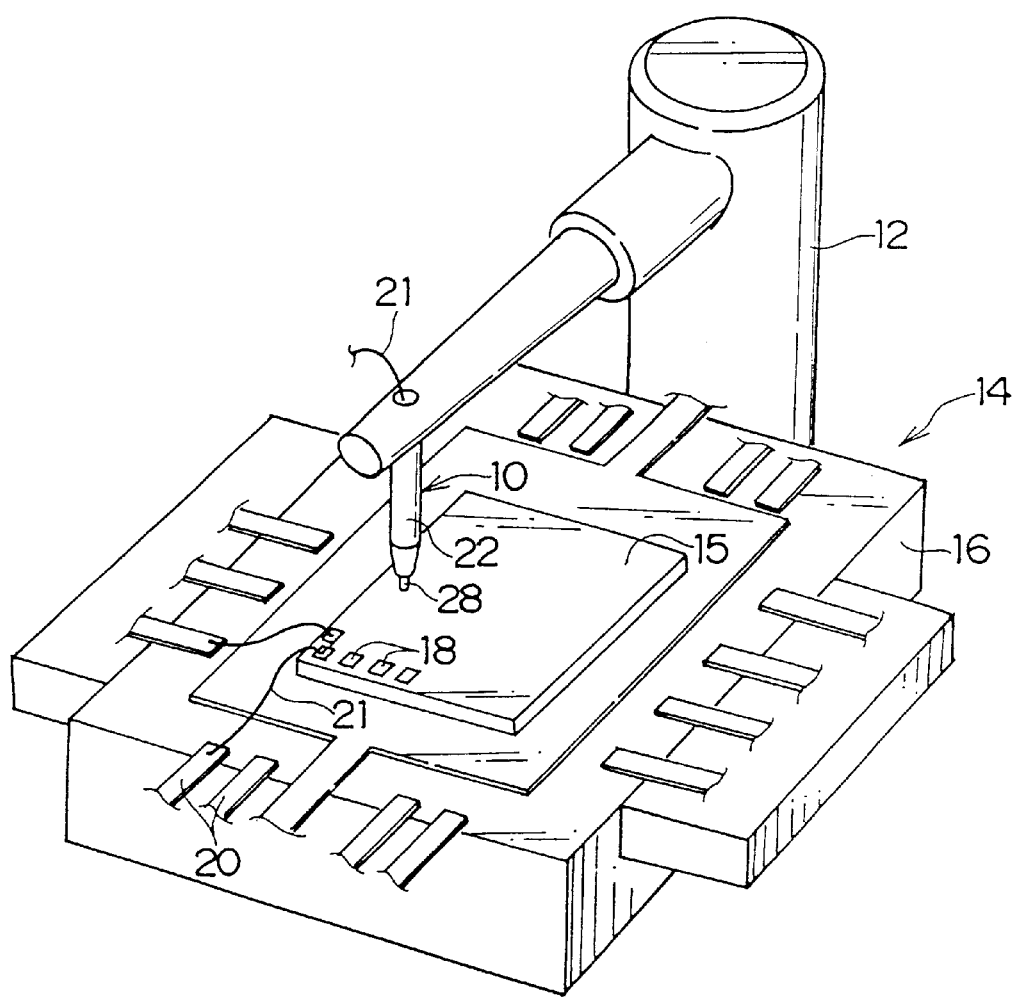

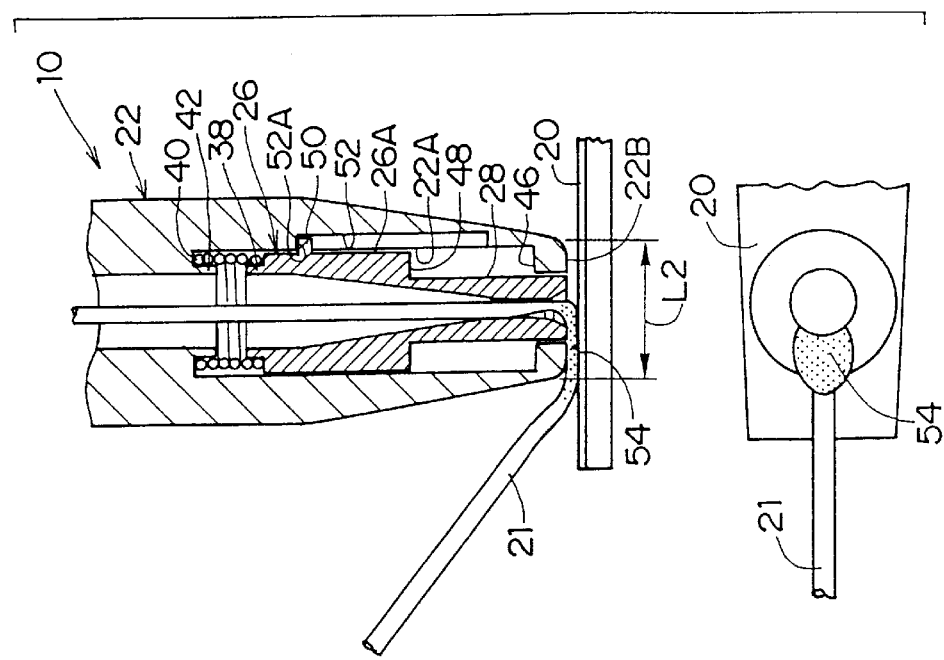
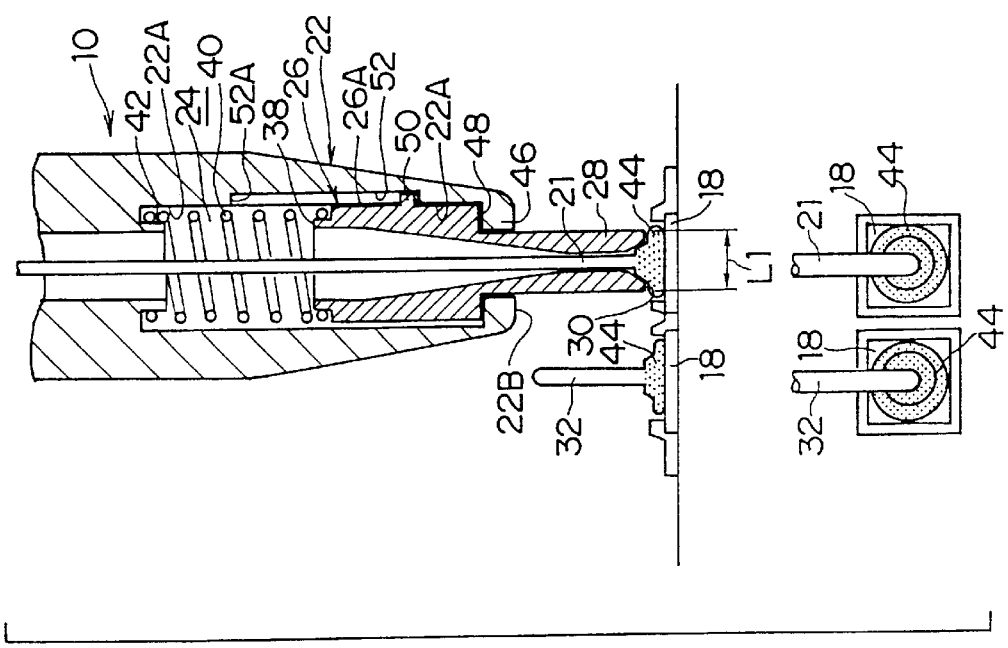

F I G. 4
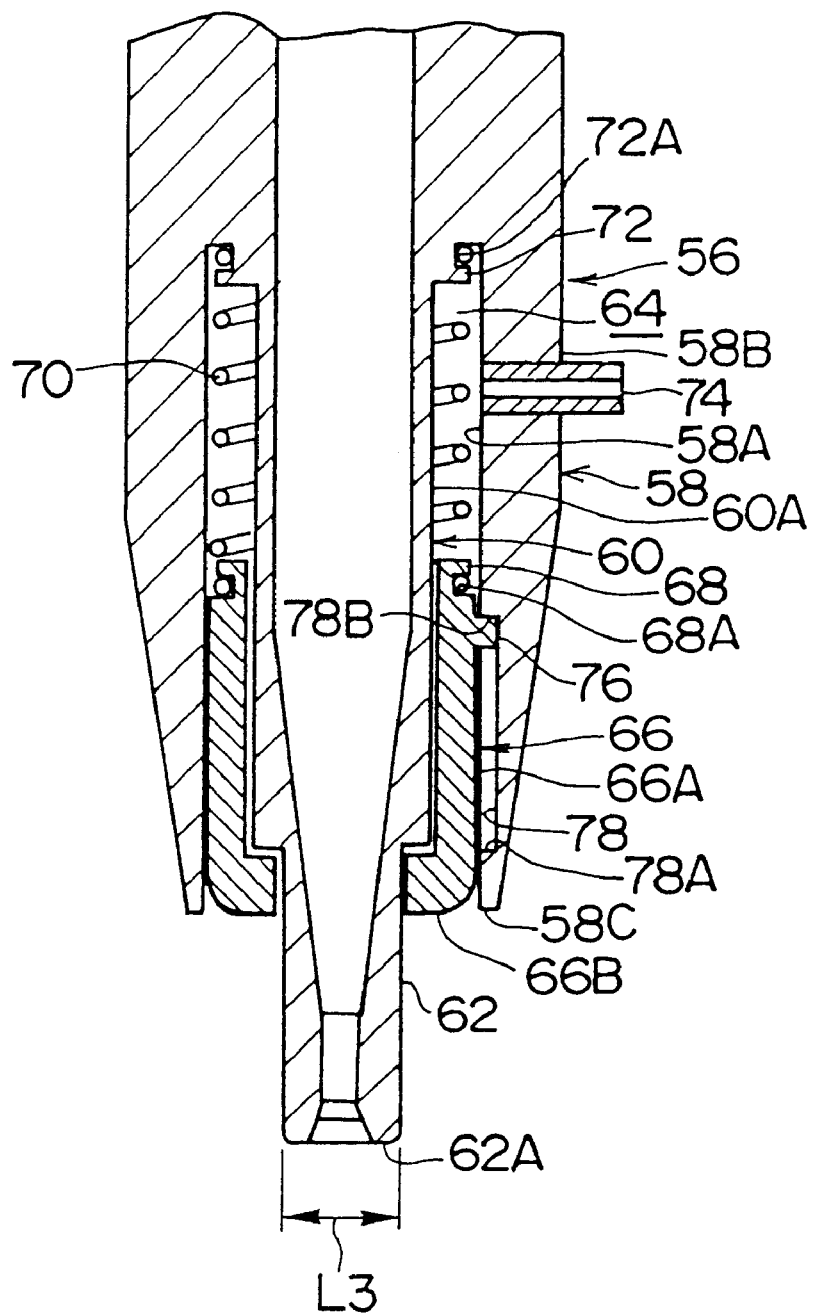

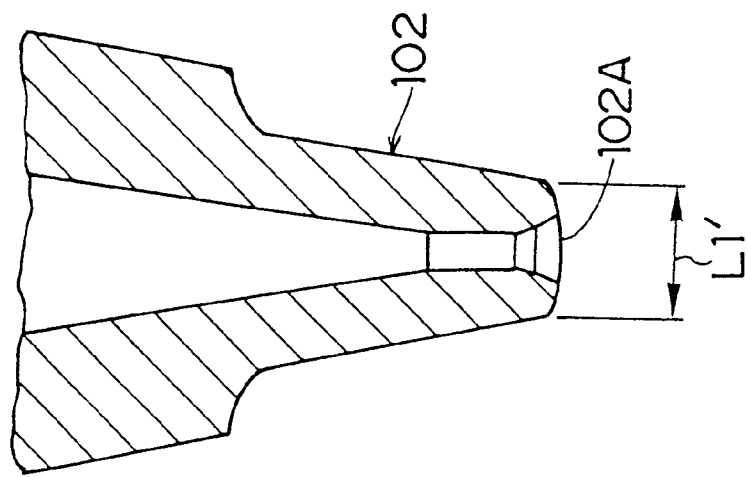
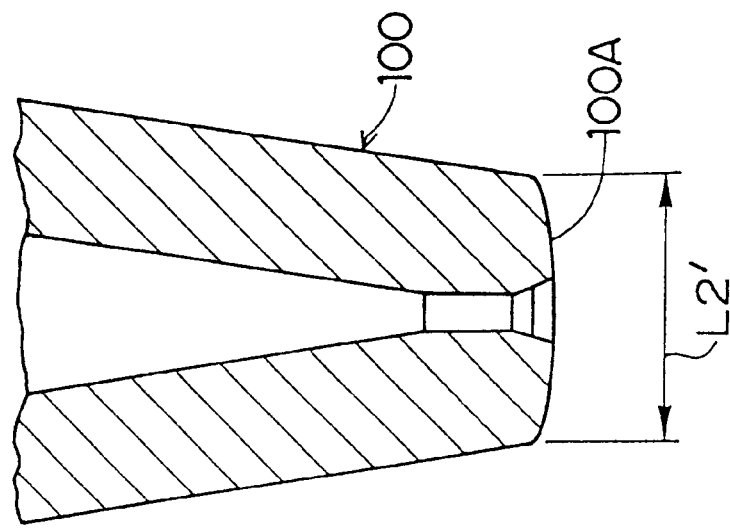

BONDING CAPILLARY AND SEMICONDUCTOR DEVICE

BACKGROUND OF THE INVENTION

1. Field of the Invention

The present invention relates to a capillary for wire bonding, and in particular for wire bonding for semiconductor devices.

2. Description of the Related Art

Generally, a capillary is formed of a cone-shaped insulating material, and a hole through which a metal wire passes is provided within the capillary.

As shown in FIGS. 6A and 6B, this capillary comes in two types, that is, a normal capillary 100 and a bottleneck capillary 102. These capillaries are distinguished from each other based on the shape of the ends thereof.

The bottleneck capillary 102 is formed in such a manner that an end thereof is made narrow in the transverse direction by shaving off an end of the normal capillary 100. The length L1' of a face surface 102A by which compression bonding portions 106 and 108 of a metal wire 104 (see FIGS. 7A and 7B) are formed, is shorter than the length L2' of a face surface 100A of the normal capillary 100.

FIG. 8 and FIGS. 9A and 9B each show a wire bonding method using the normal capillary 100. In this wire bonding method, bead bonding is employed, in which the metal wire 104 is discharged and melted by an electric torch (not shown in the drawings) and a ball (not shown in the drawings), which will be hereinafter referred to as a "bead", is formed at an end of the metal wire 104.

The bead thus formed is compressively bonded onto an electrode pad 110 by the face surface 100A of the normal capillary 100, and a compression bonding portion 112 is formed. The compression bonding portion 112 allows one end of the metal wire 104 to be joined to the electrode pad 110 on a semiconductor element 101.

The other end of the metal wire 104 is compressively bonded by the face surface 100A of the normal capillary 100 onto a post portion 116 connected to an external electrode of a semiconductor device 114, and a compression bonding portion 118 is formed. The compression bonding portion 118 allows the other end of the metal wire 104 to be joined to the post portion 116.

In such a manner as described above, the electrode pad 110 and the post portion 116 are connected by the metal wire 104. Subsequently, the metal wire 104 is cut off on the compression bonding portion 118 and wiring between the electrode pad 110 and the post portion 116 is thereby completed.

On the other hand, FIGS. 7A and 7B show a wire bonding method using the bottleneck capillary 102.

The length L1' of the face surface 102A in the bottleneck capillary 102 is shorter than that in the normal capillary 100. Therefore, the respective areas of the compression bonding portions 106 and 108 formed at the time of wire bonding are each made smaller.

When the semiconductor element 101 (see FIG. 8) is of small size and the pitch between electrode pads 120 is short, bonding is not possible in the normal capillary 100. Therefore, the bottleneck capillary 102 is used. However, in the bottleneck capillary 102, the area of the compression bonding portion 108 formed on a post portion 122 is also small, and therefore, bonding strength of the post portion 122 decreases.

Further, minuteness of the semiconductor element 101 and reduction in the pitch between the electrode pads 120 have been demanded in recent years, and it is necessary that the face surface 102A of the bottleneck capillary 102 be reduced in length. Therefore, the area of the compression bonding portion 108 further becomes smaller, and it is difficult to maintain the bonding strength of the post portion 122.

As a result, when the semiconductor device 114 has a multi-pin structure and is formed as a large-sized package due to a tendency toward the minuteness and a multifunctional structure of the semiconductor element 101, a stress acting on the compression bonding portion 108 of the post portion 122 becomes larger at the time of resin-sealing of the semiconductor element 101. Accordingly, it is difficult for the area of the compression bonding portion 108 in the bottleneck capillary 102 in the present state to withstand a stress acting at the time of resin-sealing for the semiconductor element 101.

In view of the above-described circumstances, it is an object of the present invention to provide a capillary which prevents an electrode pad of a micro-sized and multifunctional semiconductor element from contacting an adjacent wire previously subjected to wiring and which allows the area of a compression bonding region in a post portion to increase.

SUMMARY OF THE INVENTION

In a first aspect of the present invention, there is provided a capillary used for wire bonding, wherein a compression bonding area formed when a metal wire is bonded onto a post portion to be connected to an electrode pad formed on a semiconductor element is made larger than a compression bonding area formed when the metal wire is bonded onto the electrode pad.

Thus, the respective compression bonding areas in the electrode pad and in the post portion can be changed appropriately. Therefore, even when the semiconductor element is of small size and the pitch between electrode pads is short, the compression bonding area on the post portion can be increased.

As a result, the bonding strength of the post portion increases. Even if the semiconductor device has a multi-pin structure and is formed as a large-sized package, the post portion can withstand a stress acting thereon at the time of resin-sealing for the semiconductor element.

In a second aspect of the present invention, there is provided a semiconductor device in which a pitch between post portions respectively connected to electrode pads formed on a semiconductor element is made greater than a pitch between the electrode pads, and a compression bonding area formed when a metal wire is bonded onto the post portion is larger than a compression bonding area formed when the metal wire is bonded onto the electrode pad.

The pitch between the post portions is made greater than the pitch between electrode pads. Therefore, even if the compression bonding area formed by bonding for the post portion is made larger than the compression bonding area formed by bonding for the electrode pad, short circuits do not occur between the post portions.

In a third aspect of the present invention, an accommodating portion is provided at an end of the capillary main body, and a movable portion through which a wire passes is accommodated in the accommodating portion. The movable portion slides to protrude from the end of the capillary main body, wherein further movement in this direction is prevented. Further, urging means is accommodated in the accommodating portion and urges the movable portion toward the end of the capillary main body.

When a metal wire is bonded onto the electrode pad formed on the semiconductor element, a molten metal wire is compressively bonded by the movable portion using pressing means. Further, when the metal wire is bonded onto a post portion to be connected to the electrode pad, the metal wire is compressively bonded by the movable portion and the end of the capillary main body, using the pressing means.

So long as the movable portion is thus made to slide, when bonding is carried out for the electrode pad, the metal wire can be compressively bonded only by the movable portion. Further, when bonding is carried out for the post portion, the metal wire can be compressively bonded by the end of the capillary main body and the movable portion acting together.

As a result, respective functions of a normal capillary and a bottleneck capillary can be provided by a single capillary. Moreover, the compression bonding area in the post portion can be easily made larger than the compression bonding area in the electrode pad.

In a fourth aspect of the present invention, the accommodating portion includes an inner peripheral surface having a groove defined therein and extending in a direction that the movable portion slides, and the movable portion including an outer peripheral surface having a projection extending into the groove and sliding therein as the movable portion slides.

Accordingly, the projection formed in the movable portion is engaged with the groove formed along a direction in which the movable portion slides. Therefore, the movable portion is substantially prevented from rotating, although it slides. As a result, there is reduced risk that a compression bonding portion or the like will be displaced at the time of bonding for the post portion.

In a fifth aspect of the present invention, the movable portion and the capillary main body each include an end surface, and a stopper is provided in the groove at a location preventing further movement of the projection and the movable portion when the end surfaces substantially align with one another.

Thus, sliding movement of the movable portion is regulated at the position where the end surface of the movable portion and the end face of the end of the capillary main body are placed on substantially the same plane. Therefore, bonding is carried out for the post portion in the state in which the length of the face surface is effectively of the transverse dimension of the end surface of the movable portion and of the end face of the end of the capillary main body together.

In a sixth aspect of the present invention, a fixed body through which a wire passes is provided in a core portion of a capillary main body. The fixed body protrudes from the end of the capillary main body.

An annular hollow portion is provided between the fixed body and the capillary main body. The hollow portion is sealed substantially airtight by a moving body. The moving body slides while maintaining a substantially sealed state and protrudes from the end of the capillary main body, whereupon further movement in the protruding direction is prevented.

Additionally, air can be supplied into and exhausted from the hollow portion by an air supply/exhaust opening. The hollow portion includes tension means accommodated therein, and the tension means retracts the moving body back into the hollow portion.

When the metal wire is bonded onto the electrode pad formed on a semiconductor element, a molten metal wire is compressively bonded by the fixed body when air is exhausted from the air supply/exhaust opening and the moving body is retracted into the hollow portion by the tension means.

When the metal wire is bonded onto a post portion to be connected to the electrode pad, the metal wire is compressively bonded by the fixed body and the moving body protruding from the end of the capillary main body due to pressure of air supplied from the air supply/exhaust opening.

In a seventh aspect of the present invention, the hollow portion includes an inner peripheral surface having an engagement groove defined therein and extending in a direction in which the moving body slides, and the moving body includes an outer peripheral surface having an engaging portion disposed slidably in the engagement groove and sliding therein as the moving body slides.

In an eighth aspect of the present invention, the moving body and the fixed body each include an surface, and an engagement stopper is provided in the engagement groove and regulates movement of the engaging portion so that the end surfaces substantially align with one another.

Accordingly, movement of the engaging portion is not only regulated by the engagement stopper at the position where the end surface of the moving body and the end surface of the fixed body are placed on substantially the same plane, but it is also unnecessary to separately provide a removal-preventing stopper for retaining the moving body within the capillary main body.

BRIEF DESCRIPTION OF THE DRAWINGS

FIG. 1 is a perspective view which schematically shows a state in which wire bonding is carried out using a capillary according to a first preferred embodiment of the present invention.

FIG. 3A is a cross sectional view showing bonding for an electrode pad carried out using a capillary according to the first preferred embodiment, and FIG. 3B is a cross sectional view showing bonding for a post portion carried out using the capillary according to the first preferred embodiment.

FIG. 4 is a cross sectional view showing a capillary according to a second preferred embodiment of the present invention.

FIG. 6A is a cross sectional view showing a face surface of a normal capillary, and FIG. 6B is a cross sectional view showing a face surface of a bottleneck capillary.

DESCRIPTION OF THE PREFERRED EMBODIMENTS

Figure 2:
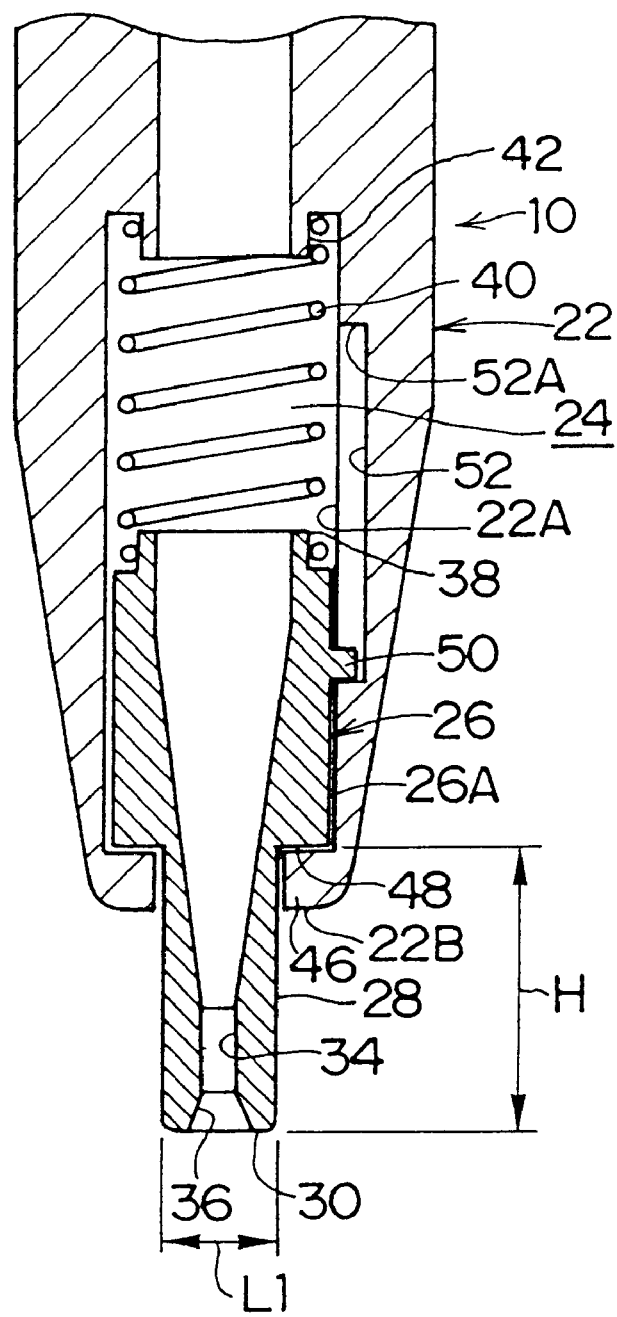
FIG. 2 is a cross sectional view of the capillary of FIG. 1.

FIG. 1 shows a first preferred embodiment of capillary 10 according to the present invention. The capillary 10 is mounted at a bonding head 12 which can be moved in the vertical direction. A semiconductor device 14 to be bonded by the capillary 10 is placed on an X-Y table 16, which can be moved in horizontal directions.

With the X-Y table 16 and the bonding head 12 appropriately positioned, electrode pads 18, on a semiconductor element 15 provided on the semiconductor device 14, each coated with a metal film, and post portions 20 connected to external electrodes of the semiconductor device 14, are respectively connected together by a so-called wire bonding method using a metal wire 21.

FIG. 2 and FIGS. 3A and 3B each show a cone-shaped capillary main body 22 formed of an insulating material. An accommodating portion 24 is provided within the capillary main body 22 at the side of the narrow end thereof. A cylindrical movable portion 26 is accommodated in the accommodating portion 24 and is allowed to be slidable within the accommodating portion 24 along an axial direction of the capillary main body 22.

An inner peripheral surface 22A of the capillary main body 22 and an outer peripheral surface 26A of the movable portion 26 are each subjected to surface treatment such as resin coating, so as to allow smooth sliding of the movable portion 26.

A cylindrical small-diameter portion 28 protrudes from a lower end surface of the movable portion 26 and an end surface 30 of the small-diameter portion 28 is formed as a substantially flat surface in the same manner as in the face surface 102A (see FIG. 6B) of the bottleneck capillary 102. The length L1 of a face surface, which is an outside dimension of the end surface 30, is equal to the length L1' of the face surface 102A.

The length H of the small-diameter portion 28 is set such that an end portion 22B of the capillary main body 22 does not contact a metal wire 32 adjacent thereto when the small-diameter portion 28 protrudes from the end portion 22B (see FIG. 3A).

A hole 34 is formed in the axial center of the small-diameter portion 28 and the metal wire 21 can be inserted into and pass through the hole 34. The metal wire 21 is discharged and melted by an electric torch (not shown in the drawings) and a bead (not shown in the drawings) is formed at the end of the wire.

A tapered portion 36 is provided in the small-diameter portion 28 near the end surface 30 and the hole diameter of the hole 34 increases as it approaches the end surface 30. The tapered portion 36 allows formation of a bead of a fixed size, and the bead becomes a base of the metal wire 21 joined to the electrode pad 18 so that the metal wire 21 can be formed upright. For this reason, there is reduced risk of the metal wire 21 extending lengthwise and contacting an adjacent metal wire 32 previously joined to the electrode pad 18.

A cylindrical pedestal 38 protrudes from the upper end surface of the movable portion 26. One end of a spring 40 which serves as urging means, can be mounted around the pedestal 38. Similarly, a cylindrical pedestal 42 protrudes from the accommodating portion 24 of the capillary main body 22, and the other end of the spring 40 can be mounted around the pedestal 42. The movable portion 26 is urged by the spring 40 in a direction in which the small-diameter portion 28 protrudes from the end portion 22B of the capillary main body 22.

The load of the spring 40 is set in the range between a set load when the metal wire 21 is bonded onto the electrode pad 18, and a set load when the metal wire is bonded onto the post portion 20 (between about 490 mN to 980 mN).

Accordingly, as shown in FIG. 3A, when the metal wire 21 is bonded onto the electrode pad 18, a set load during wire bonding is less than the urging force of the spring 40. Therefore, bonding is carried out in a state in which the small-diameter portion 28 protrudes from the end portion 22B of the capillary main body 22.

As a result, a compression bonding portion 44 having the same area as that of the compression bonding portion 106 formed by bonding using the bottleneck capillary 102 (see FIG. 7A) is formed, to thereby causing the metal wire 21 to be joined to the electrode 18.

Further, as shown in FIG. 3B, when the metal wire 21 is bonded onto the post portion 20, the set load during wire bonding is greater than the urging force of the spring. Therefore, the small-diameter portion 28 is retracted into the accommodating portion 24 of the capillary main body 22.

The end portion 22B of the capillary main body 22 is designed so as to be made parallel to the end surface 30 of the small-diameter portion 28, and a face angle of the end portion 22B with respect to the horizontal plane is arbitrarily set in a range from 0 to 15 degrees.

Further, when the end portion 22B of the capillary main body 22 and the end surface 30 of the small-diameter portion 28 are placed on the same plane (which will be described later), an end surface of the capillary 10 is formed in the same manner as the face surface 100A of the normal capillary 100. The length L2 of the face surface of the capillary 10 is therefore substantially equal to the dimension of the tip end, which is substantially equal to the length L2' of the face surface of the normal capillary 100 (see FIG. 6A).

Figure 9A:
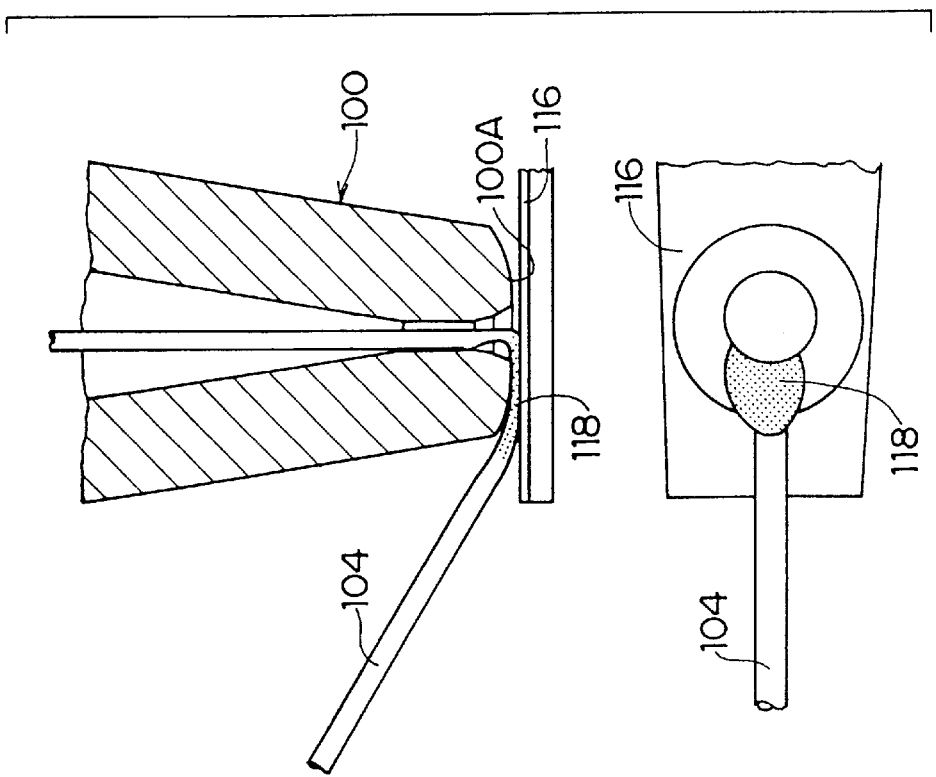
FIG. 9A is a cross sectional view showing bonding for an electrode pad carried out using a conventional or normal capillary.
Figure 9B:
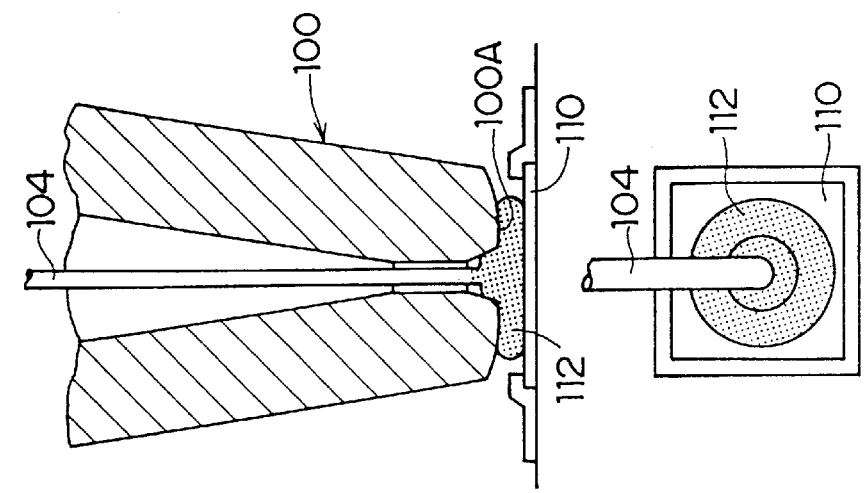
FIG. 9B is a cross sectional view showing bonding for a post portion carried out using a conventional or normal capillary.

Due to above-described structure, when the metal wire 21 is bonded onto the post portion 20, the compression bonding portion 44 has substantially the same area as that of the compression bonding portion 118 formed by bonding using the normal capillary 100 (see FIG. 9B). As a result, the electrode pad 18 and the post portion 20 are connected together by the metal wire 21.

An annular regulating portion 46 is formed in the end portion 22B of the capillary main body 22 so as to protrude from the inner peripheral surface 22A. A shoulder portion 48 by which the small-diameter portion 28 and the movable portion 26 are connected can be brought into contact with the regulating portion 46.

As a result, when the small-diameter portion 28 protrudes from the capillary main body 22, the shoulder portion 48 abuts against the regulating portion 46 so as to prevent the movable portion 26 from being removed from the capillary main body 22.

A pin-shaped projection 50 protrudes from the outer peripheral surface 26A of the movable portion 26. A rectangular groove 52 is formed on the inner peripheral surface 22A of the capillary main body 22 along a direction in which the movable portion 26 slides. The projection 50 is provided so as to be movable in a state of being engaged with the groove 52.

The projection 50 is thus engaged with the groove 52 formed along the direction in which the movable portion 26 slides. Therefore, the movable portion 26 does not rotate although it slides. Accordingly, there is reduced risk that a compression bonding portion 54 and/or the like will be displaced when bonding is performed for the post portion 20.

Further, when the small-diameter portion 28 is retracted into the accommodating portion 24 of the capillary main body 22, the projection 50 abuts against the end 52A of the groove when the end portion 22B of the capillary main body 22 and the end surface 30 of the small-diameter portion 28 are placed on substantially the same plane to thereby regulate movement of the movable portion 26.

Accordingly, when bonding is performed for the post portion 20, the length L2 of the face surface of the capillary is approximately equal to the transverse dimension of the end portion 22B of the capillary main body 22 including the transverse dimension of the end surface 30 of the small-diameter portion 28.

In this case, the pitch between the post portions 20 of the semiconductor device 14 is greater than the pitch between the electrode pads 18. For this reason, even if the area of the compression bonding portion 54 formed when the metal wire 21 is bonded onto the post portion 20 is larger than the area of the compression bonding portion 44 formed when the metal wire 21 is bonded onto the electrode pad 18, no short circuit occurs between the post portions 20.

Next, operation of the capillary 10 according to the first embodiment of the present invention will be described.

As illustrated in FIG. 1 and FIGS. 3A and 3B, the semiconductor element 15 is placed on the X-Y table 16 and the electrode pads 18, each coated with a metal film, are formed on the semiconductor element 15.

The set load (of wire bonding) when the metal wire 21 is bonded onto the electrode pad 18 is less than the urging force of the spring 40. Therefore, when the metal wire 21 is bonded onto the electrode pad 18, the small-diameter portion 28 of the capillary main body 22 protrudes from the end portion 22B of the capillary main body 22.

In the above-described state, when the metal wire 21 is bonded onto the electrode pad 18, the length L1 of the face surface is the outside dimension of the end surface 30 of the small-diameter portion 28, which is substantially equal to the length L1' of the face surface of the normal capillary 100. Accordingly, even when the semiconductor element 15 is of small size and the pitch between the electrode pads 18 is short, bonding is carried out for the electrode pads 18 without causing short circuits between adjacent electrode pads 18.

Further, when the small-diameter portion 28 protrudes from the end portion 22B of the capillary main body 22, the length H of the small-diameter portion 28 is set such that the end portion 22B does not contact the metal wire 32 adjacent thereto. Therefore, there is reduced risk that the end portion 22B will contact a previously-bonded metal wire 32, as a wire is being bonded.

Next, as shown in FIG. 3B, when bonding the metal wire 21 onto the post portion 20 connected to the electrode pad 18, the set load of wire bonding is greater than the urging force of the spring 40. Therefore, the small-diameter portion 28 is retracted into the accommodating portion 24 of the capillary main body 22 and the projection 50 abuts against the groove end 52A, to thereby regulate movement of the projection 50.

In the above-described state, the end portion 22B of the capillary main body 22 and the end surface 30 of the small-diameter portion 28 are placed on substantially the same plane (are approximately even with one another). The length L2 of the face surface thus substantially equals the transverse dimension or diameter of the end portion 22B of the capillary main body 22. As a result, the compression bonding portion 54 having substantially the same area as that formed by bonding using the normal capillary 100 can be achieved.

Accordingly, the area of the compression bonding portion 54 formed when the metal wire 21 is bonded onto the post portion 20 is larger than the area of the compression bonding portion 44 (see FIG. 3A) formed when the metal wire 21 is bonded onto the electrode pad 18.

As described above, in the present embodiment, respective functions of the normal capillary 100 (see FIG. 6A) and the bottleneck capillary 102 (see FIG. 6B) can be provided by a single capillary 10. Further, the areas of the compression bonding portions 44 and 54 formed when the metal wire 21 is bonded onto each of the electrode pad 18 and the post portion 20 can be easily changed using the single capillary 10. Accordingly, even when the semiconductor element 15 (see FIG. 1) is of small size and the pitch (or spacing) between the electrode pads 18 is small, the area of the compression bonding portion 54 on the post portion 20 can be made larger.

As a result, the bonding strength of the post portion 20 increases, and even if the semiconductor device 14 (see FIG. 1) has a multi-pin structure and is formed as a large-sized package, the post portion 20 can withstand stress acting thereon at the time of resin-sealing for the semiconductor element 15.

Next, a description will be given of a second preferred embodiment of capillary 56 according to the present invention. Note that description duplicative of the first preferred embodiment will be omitted.

As shown in FIG. 4, a cylindrical fixed body 60 is provided in the axial center portion of a cone-shaped capillary main body 58. The fixed body 60 is formed integrally with the capillary main body 58 or is integrated with the capillary main body 58 by adhesion. An end chip 62 corresponding to the small-diameter portion 28 (see FIG. 2) of the first embodiment protrudes from the lower end surface of the fixed body 60.

An end surface 62A of the end chip 62 is formed as a substantially flat surface in the same manner as in the face surface 102A (see FIG. 6B) of the bottleneck capillary 102. The length L3 of the face surface which is the outside dimension of the end surface 62A is equal to the length L1' of the face surface 102A of the bottleneck capillary 102.

Further, an annular hollow portion 64 is provided between an inner peripheral surface 58A of the capillary main body 58 and an outer peripheral surface 60A of the fixed body 60. A movable chip 66 formed as a cylindrical moving body is accommodated in the hollow portion 64 so as to allow sealing of an interior of the hollow portion 64. The movable chip 66 is provided so as to be slidable within the hollow portion 64 along an axial direction of the capillary main body 58 while maintaining the sealed state of the hollow portion 64.

The inner peripheral surface 58A of the capillary main body 58 and the outer peripheral surface 66A of the movable chip 66 are each subjected to surface treatment such as resin coating, to thereby allow smooth sliding of the movable chip 66.

An annular protruding portion 68 protrudes from an upper end surface of the movable chip 66. An annular groove 68A is formed on an outer peripheral surface of the protruding portion 68, and one end of a return spring 70 serving as tension means can be mounted in the groove 68A.

Similarly, an annular protruding portion 72 protrudes from the hollow portion 64 of the capillary main body 58. An annular groove 72A is formed on the outer peripheral surface of the protruding portion 72 and the other end of the return spring 70 can be mounted in the groove 72A.

The return spring 70 causes the movable chip 66 to be pulled back in a direction in which it is accommodated in the hollow portion 64 (that is, in a direction opposite to a direction of the end of the capillary main body 58). Further, both ends of the return spring 70 are respectively mounted in the annular grooves 68A and 72A. Therefore, the return spring 70 remains mounted within the capillary main body 58.

Further, an air supply/exhaust opening 74 is provided in the outer peripheral surface 58B of the capillary main body 58 and communicates with the hollow portion 64. An air compressor (not shown in the drawings) is connected to the air supply/exhaust opening 74. When a power source of the air compressor is turned on, air is supplied into the air supply/exhaust opening 74.

Figure 5A:
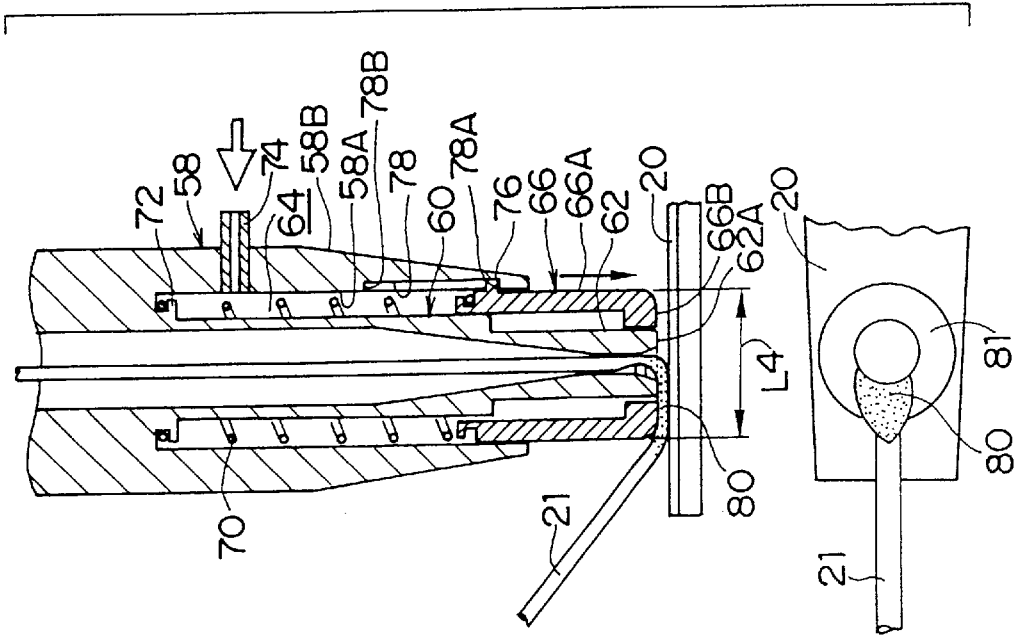
FIG. 5A is a cross sectional view showing bonding for an electrode pad carried out using the capillary according to the second preferred embodiment.
Figure 5B:
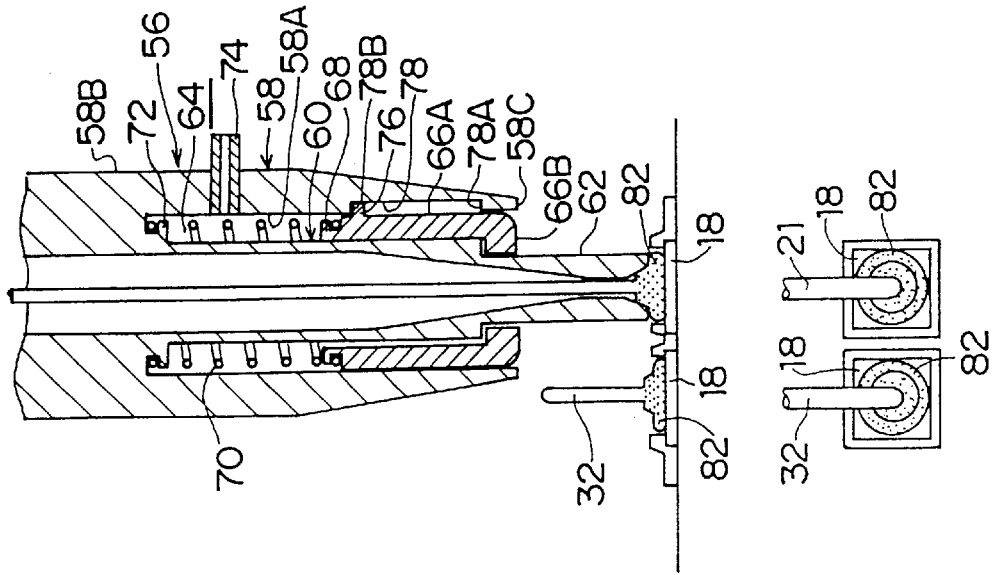
FIG. 5B is a cross sectional view showing bonding for a post portion carried out using the capillary according to the second preferred embodiment.

At this time, as illustrated in FIG. 5B, the return spring 70 is stretched due to air pressure and the movable chip 66 protrudes from the end portion 58C of the capillary main body 58.

An engaging portion 76 formed in the movable chip 66, which will be described later, abuts against a groove wall 78A of an engagement groove 78 provided in the capillary main body 58. This arrangement thereby regulates movement of the movable chip 66.

At this time, the end surface 66B of the movable chip 66 and the end surface 62A of the end chip 62 are placed substantially on the same plane. That is, the surfaces substantially align. Thus, the length L4 of the face surface therefore substantially equals the transverse dimension of the end surface 66B.

In the above-described state, when bonding is carried out, a compression bonding portion 70 having the same area as that of the compression bonding portion 118 formed by using the normal capillary 100 (see FIG. 9B) is formed, and the metal wire 21 is joined to the post portion 20.

When the power source for the air compressor is turned off, the supply of air stops. As shown in FIG. 5A, the stretched return spring 70 returns its previous state, and air within the hollow portion 64 is exhausted from the air supply/exhaust opening 74. Further, the movable tip 66 is accommodated in the hollow portion 64.

As a result, the length of the face surface becomes the face surface length L3 of the end surface 62A of the end chip 62. When bonding is carried out in this state, a compression bonding portion 82 having the same area as that of the compression bonding portion 106 formed by bonding using the bottleneck capillary 102 (see FIG. 7A) is formed, and the metal wire is joined to the electrode pad 18.

A pin-shaped engaging portion 76 protrudes from the outer peripheral surface 66A of the movable chip 66. Further, a rectangular engagement groove 78 corresponding to the groove 52 (see FIG. 2) of the first embodiment is formed in the outer peripheral surface 58A near the end of the capillary main body 58 along the direction in which the movable chip 66 slides. The movable chip 66 is thus slidable in such a manner that the engaging portion 76 engages with the engagement groove 78.

When the power source of the air compressor is turned on and the movable chip 66 is made to slide so as to be protruded from the end portion 58C of the capillary main body 58, the engaging portion 76 abuts against the groove wall 78A. This serves as an engagement stopper, at the position where the end surface 66B of the movable chip 66 and the end surface 62A of the end chip 62 are placed on substantially the same plane.

As described above, the groove wall 78A positions the movable chip 66 and prevents the movable chip 66 from being removed from the capillary main body 58. Accordingly, there is no need for separately providing a stopper for preventing removal of the movable chip 66.

Next, operation of the capillary 56 according to the second embodiment will be described.

In performing bonding for the electrode pad 18, the power source of the air compressor is turned off and the movable chip 66 is accommodated in the hollow portion 64 due to restoring force of the return spring 70.

As a result, as shown in FIG. 5A, the end chip 62 is exposed. In this state, the metal wire 21 is bonded onto the electrode pad 18. At this time, the compression bonding portion 82 is formed on the electrode pad 18, and the metal wire 21 is thereby joined to the electrode pad 18.

Figure 7A:
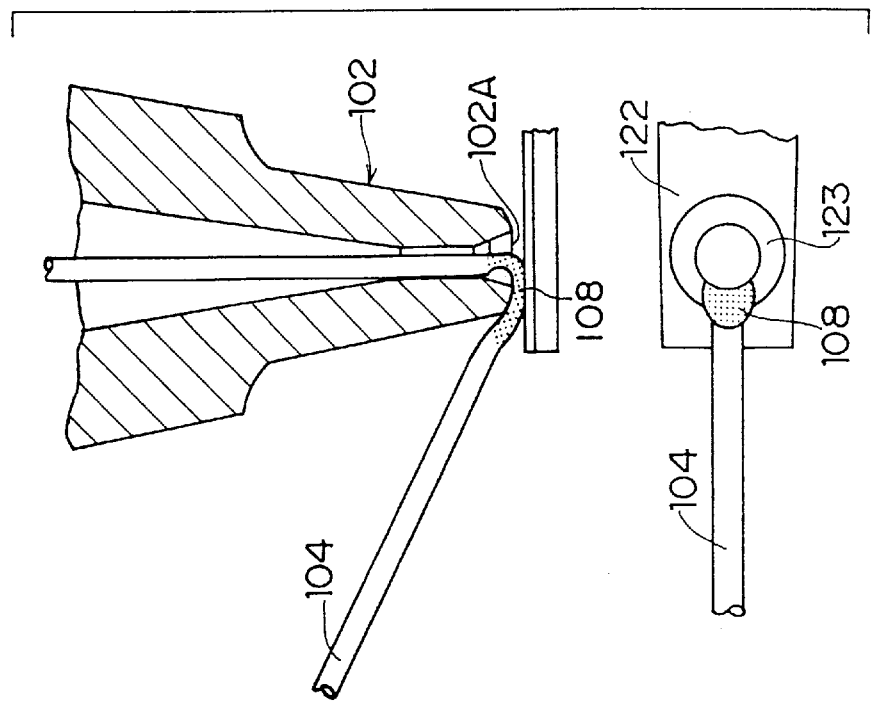
FIG. 7A is a cross sectional view showing a state in which bonding for an electrode pad is carried out using a bottleneck capillary.

In this case, the compression bonding portion 82 has the same area as that of the compression bonding portion 106 formed by bonding using the bottleneck capillary 102 (see FIG. 7A). As a result, even when the semiconductor element 15 is of small size and the pitch between the electrode pads 18 is short, bonding can be carried out without causing the movable chip 66 to contact an adjacent wire 32.

Further, when bonding is carried out for the post portion 20, the power source of the air compressor is turned on and air is supplied to the air supply/exhaust opening 74. The movable chip 66 is therefore caused to slide so as to protrude from the end portion of the capillary main body 58.

The engaging portion 76 abuts against the groove wall 78A at the position where the end surface 66B of the movable chip 66 and the end surface 62A of the end chip 62 are placed on substantially the same plane. Movement of the movable chip 62 is thereby regulated. Thus, bonding for the post portion 20 is carried out in the state in which the end surface 66B of the movable chip 66 and the end surface 62A of the end chip 62 are placed on substantially the same plane.

At this time, the compression bonding portion 80 is formed on the post portion 20, and the metal wire 20 joined to the electrode pad 18 is connected to the post portion 20 by the compression bonding portion 80. In this case, the compression bonding portion 80 has substantially the same area as that of the compression bonding portion 118 formed by bonding using the normal capillary 100 (see FIG. 9B).

Figure 7B:
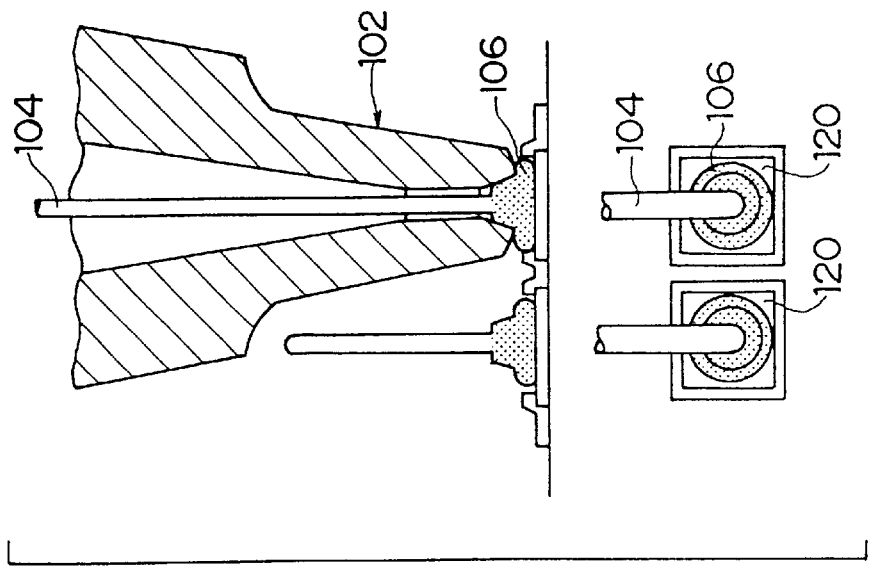
FIG. 7B is a cross sectional view showing bonding for a post portion carried out using the bottleneck capillary.
Figure 8:
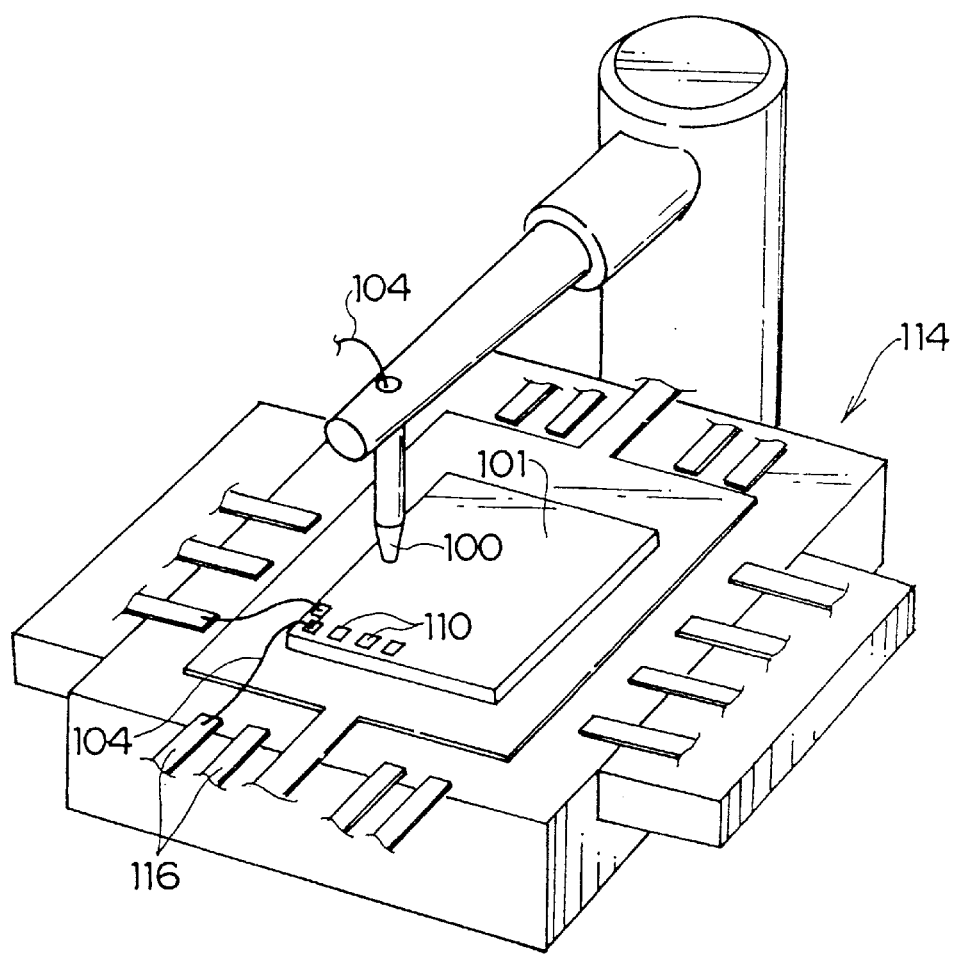
FIG. 8 is a perspective view schematically showing wire bonding carried out using a conventional or normal capillary.

As a result, the area of the compression bonding portion 118 is made larger than the area of the compression bonding portion 108 formed when the metal wire 21 is bonded onto the post portion 122 in the bottleneck capillary 102 shown in FIG. 7B. Further, substantially the same result is obtained with a capillary impression 81, and the area of the capillary impression 81 is made larger than that of a capillary impression 123.

Accordingly, the bonding strength of the post portion 20 increases. Hence, even if the semiconductor device 14 (see FIG. 1) has a multi-pin structure and is formed as a large-sized package, the post portion 20 can withstand stress acting thereon at the time of resin-coating for the semiconductor element 15.

In the first described preferred embodiment, the small-diameter portion 28 is caused to slide by using a simple structure based on the relation between the urging force of the spring 40 and the set load at the time of bonding. When the metal wire 21 is bonded onto the post portion 20 shown in FIG. 3B, the end surface 30 of the small-diameter portion 28 strikes against the post portion 20 before the end portion 22B of the capillary main body 22 strikes against the post portion 20.

For this reason, it is necessary to delay application of ultrasonic waves for joining the metal wire 21 to the post portion 20. However, due to the movable chip 66 being mechanically caused to slide using the air compressor as in the second embodiment, bonding speed can be increased relative to the first described preferred embodiment.

In the present invention, a description was given of the case in which the compression bonding portion 54 of the post portion 20 is made larger than the area of the compression bonding portion 44 of the electrode pad 18. These compression bonding portions may be provided in accordance with variable conditions, for example, a pitch between post portions, or a pitch between electrode pads.

Due to the above-described structure, in the first aspect of the present invention, the bonding strength of the post portion increases. Even if a semiconductor device has a multi-pin structure and is formed as a large-sized package, the post portion can withstand stress acting thereon at the time of resin-coating for a semiconductor element. In the second aspect of the present invention, due to the pitch between electrode pads being made greater than the pitch between post portions, even if the area of the compression bonding portion when a metal wire is bonded onto a post portion is made larger than the area of a compression bonding portion when the metal wire is bonded onto an electrode pad, short circuits do not occur between post portions. In the third aspect of the present invention and according to FIGS. 6A and 6B, respective functions of the normal capillary and the bottleneck capillary can be provided by one capillary of the present invention, and the area of a compression bonding portion on a post portion can be easily made larger than the area of a compression bonding portion on an electrode pad. In the fourth aspect of the present invention and according to FIGS. 7A and 7B, there is reduced risk that a compression bonding portion or the like will be displaced at the time of bonding for a post portion. In the fifth aspect of the present invention, sliding movement of a movable portion is regulated at the position where an end surface of the movable portion and an end face of the end of the capillary main body are placed on substantially the same plane. Therefore, the metal wire is bonded onto the post portion in a state in which the length of the face surface equals the length of the transverse dimension of the end surface of the movable portion and of the end of the capillary main body. In the eighth aspect of the present invention, the movement of an engaging portion is regulated by an engagement stopper at the position where an end surface of a moving body and an end surface of a fixed body are placed on substantially the same plane. Further, it is not necessary to separately provide a removal-preventing stopper for retaining the moving body within the capillary main body.

What is claimed is:

1. A capillary for bonding a wire to an electrode pad on a semiconductor element and to a post portion, the capillary comprising:

(a) a capillary main body including an end, the capillary main body having an accommodating portion;

(b) a movable portion accommodated in said accommodating portion, and being slidable to a position protruding from the end of the capillary main body, said movable portion including a passage for inserting the wire to pass therethrough; and (c) a resiliently deformable member accommodated in said accommodating portion, and resiliently deformed therein so as to urge said movable portion towards the end of the capillary main body, wherein, when the wire is bonded onto the electrode pad on the semiconductor element, the wire is compressively bonded by said movable portion, and when the wire is bonded onto the post portion for connection to the electrode pad, the metal wire is compressively bonded by the end of the capillary main body and said movable portion.

2. The capillary of claim 1, wherein said accommodating portion includes an inner peripheral surface having a groove defined therein and extending in a direction in which the movable portion slides, and said movable portion includes an outer peripheral surface having a projection extending into said groove and sliding therein as the movable portion slides.

3. The capillary of claim 2, wherein said movable portion and said capillary main body each include an end surface, and a stopper is provided in the groove at a location preventing further movement of the projection and the movable portion when said end surfaces substantially align with one another.

4. A capillary for bonding a wire to an electrode pad on a semiconductor element and to a post portion, the capillary comprising:

(a) a capillary main body having an end, a core portion, and a fixed body provided in the core portion, with the fixed body protruding from the end of the capillary main body, said fixed body including a passage for insertion of the wire therethrough;

(b) an annular hollow portion provided between said fixed body and the capillary main body;

(c) a moving body substantially sealing said hollow portion, and being slidable while maintaining a substantial seal to a position protruding from the end of the capillary main body;

(d) an air supply-exhaust opening for supplying air into, and exhausting air from, said hollow portion; and (e) a resiliently deformable member accommodated in said hollow portion and resiliently deformed to urge said movable body to retract into said hollow portion, wherein, when the wire is bonded onto the electrode pad of the semiconductor element, the wire is compressively bonded by said fixed body when air is exhausted from said air supply-exhaust opening and said moving body is retracted into said hollow portion due to said resiliently deformable member, and when the wire is bonded onto the post portion for connection to the electrode pad, the wire is compressively bonded by said fixed body and said moving body protruding from the end of the capillary main body due to air pressure from air supplied to said supply-exhaust opening.

5. The capillary of claim 4, wherein said hollow portion includes an inner peripheral surface having an engagement groove defined therein and extending in a direction in which said moving body slides, and said moving body includes an outer peripheral surface having an engaging portion disposed slidably in said engagement groove and sliding therein as said moving body slides.

6. A capillary according to claim 5, wherein said moving body and said fixed body each include a surface, and an engagement stopper is provided in said engagement groove and regulates movement of said engaging portion so that said end surfaces substantially align with one another.

* * * * *